United States Patent
Miki

(10) Patent No.: US 7,042,788 B2
(45) Date of Patent: May 9, 2006

(54) POWER SUPPLY CIRCUIT AND SEMICONDUCTOR STORAGE DEVICE WITH THE POWER SUPPLY CIRCUIT

(75) Inventor: Atsunori Miki, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/087,663

(22) Filed: Mar. 24, 2005

(65) Prior Publication Data

US 2005/0213412 A1 Sep. 29, 2005

(30) Foreign Application Priority Data

Mar. 26, 2004 (JP) .............................. 2004-093532

(51) Int. Cl.
*G11C 7/00* (2006.01)

(52) U.S. Cl. ...................................... 365/226; 365/229

(58) Field of Classification Search ................ 365/226, 365/229

See application file for complete search history.

(56) References Cited

U.S. PATENT DOCUMENTS 5,262,999 A * 11/1993 Etoh et al. .................. 365/226
6,841,983 B1 * 1/2005 Thomas ...................... 323/322

FOREIGN PATENT DOCUMENTS

JP          2000-268562 A     9/2000

* cited by examiner

*Primary Examiner*—Tuan T. Nguyen
(74) *Attorney, Agent, or Firm*—Foley & Lardner LLP

(57) ABSTRACT

A semiconductor storage device for driving a word line by a voltage higher than an external supply voltage that includes a boost circuit for outputting a boosted voltage of a first electric potential by boosting the external power supply potential, an auxiliary capacitor for storing the output potential of the boost circuit at the time of a standby state, a switch for supplying to a word line driving power supply line a second electric potential obtained by voltage dividing the first electric potential at the time of the standby and being turned off at the time of an operation, and an amplifier circuit for receiving the first electric potential as a driving power supply potential and driving the word line driving power supply line by the second electric potential at the time of the operation.

14 Claims, 9 Drawing Sheets

POWER SUPPLY CIRCUIT AND SEMICONDUCTOR STORAGE DEVICE WITH THE POWER SUPPLY CIRCUIT

FIELD OF THE INVENTION

The present invention relates to a power supply circuit and a semiconductor storage device. More specifically, the invention relates to a power supply circuit suitable for being used in the semiconductor storage device that uses a potential obtained by boosting a power supply potential supplied from an external power supply terminal.

BACKGROUND OF THE INVENTION

In semiconductor storage devices such as an EEPROM (electrically erasable programmable read-only memory), a boosted voltage (such as 6V) obtained by boosting a supply voltage Vcc (such as 1.8V) supplied to the external power supply terminal by a boost circuit (boost converter) provided inside the semiconductor storage device is supplied as a driving power supply (also referred to as a "word line driving power supply") for a word driver that drives a word line. The word driver drives a word line selected by an X decoder that decodes an input X address to the boosted potential.

FIG. 6 is a diagram showing a typical example of a configuration of supplying a boosted voltage Vword (word line supply potential) to a power supply line that supplies a driving power supply to the word driver (that will be referred to as a "word line driving power supply line" in this specification). Referring to FIG. 6, a word line driving power supply line 22 is connected as a power supply for a plurality of word drivers not shown, and a voltage (such as 6V) obtained by boosting an external supply voltage Vcc (such as 1.8V) by a boost circuit 20 is supplied to the word line driving power supply line 22. A stabilizing capacitor 21 is connected to this word line driving power supply line 22.

FIG. 7 is a diagram schematically illustrating a typical configuration of the boost circuit 20 in FIG. 6. Referring to FIG. 7, the boost circuit 20 makes a voltage comparison between a voltage obtained by division of the output voltage of the boost circuit 20 by voltage-dividing resistors $202_1$ and $202_2$ and a reference voltage Vref using a comparison circuit 203, for example. When the output voltage of the boost circuit 20 is reduced to be equal to or less than the reference voltage Vref, the boost circuit 20 controls an oscillator (OSC) 204 such as a ring oscillator to start oscillation based on an output signal from the comparison circuit 203 indicating the result of comparison, and then to supply an oscillation clock to a charge pump 201. Then, the charge pump 201 stores electric charge in a capacitor thereof (not shown) for performing a voltage boosting operation, and stores the electric charge in an output smoothing capacitor (not shown).

By the way, in the EEPROM to be subjected to standby control, no read access is performed when the EEPROM is in a standby state, so that the word drivers are not activated. More specifically when the EEPROM is in the standby state, no word line is selected, so that it does not happen that a word driver drives a word line. For this reason, when the EEPROM is in the standby state, the voltage boosting operation of the boost circuit 20 is stopped (however, the word line driving power supply line is kept at a potential of 6V, for example).

The EEPROM is mounted on electronic devices such as cell phones, digital cameras, cell phones with cameras, and PDAs (Personal Digital Assistants) as a nonvolatile memory. Lower power consumption is demanded for battery-driving type cell phones, so that lower power consumption of the boost circuit in the standby state is demanded.

When the combined series resistance of the resistors $202_1$ and $202_2$ is indicated by R, and a current that flows through the voltage dividing resistors $202_1$ and $202_2$ is indicated by I in the boost circuit 20 in FIG. 7, for example, I=V/R holds. Since power (electric power) is expressed by an equation of $VI=V^2/R$. Thus, if the resistances of the resistors $202_1$ and $202_2$ are set to be high, the power is reduced. However, if the resistances of the resistors $202_1$ and $202_2$ are set to be high, the CR time constant of an input to the comparison circuit 203 increases, so that the response of the waveform of a signal input to the inverting input terminal (−) of the comparison circuit 203 is delayed. Further, referring to FIG. 7, the oscillator 204 performs an oscillating operation when the input signal to the comparison circuit 203 becomes equal to or less than the reference voltage Vref. However, when the response of the comparison circuit 203 is delayed, the oscillating operation of the oscillator 204 is also delayed. Accordingly, at the time of switchover from the standby state to a read operation, a reduction in the word line driving power supply potential caused by the operation of an activated word driver cannot be sufficiently coped with. Consequently, defective reading of data from a selected cell may also be brought about.

In order to maintain the word line driving power supply potential (which is also referred to as a "read time boosted potential") when a transition from the standby state to the read operation is made, a configuration should be employed in which the reaction speed of the comparison circuit 203 in FIG. 7 is sped up. In this case, supply of electric charge that has been lost during the transition from the standby state to the read operation can be performed instantly. However, if the resistances of the resistors $202_1$ and $202_2$ are set to be low, current consumption at the time of a standby will be increased.

As a publication that has disclosed a technique related to the present invention which will be described later, a description in Patent Document 1 that has disclosed a configuration provided with two boost circuits is also referred to. In this Patent Document 1, the configuration is disclosed in which a semiconductor integrated circuit (which is a DRAM using a method of applying a boosted voltage to a word line) includes first and second boost circuits. The semiconductor integrated circuit supplies a boosted voltage that is used as a word line potential with stability even if a supply voltage has been reduced. The second boost circuit generates a second boosted voltage of Vpp+α, which is higher than a boosted voltage Vpp generated by the first boost circuit. The boosted voltage Vpp becomes the word line potential. In an electrostatic capacitor element, electric charge is stored. The semiconductor integrated circuit includes a comparison circuit for comparing the boosted voltage Vpp with a threshold value. When the voltage Vpp is reduced to be lower than the threshold value due to reduction in the power supply voltage Vcc, the comparison circuit outputs a control signal to a switching unit so that the electric charge stored in the electrostatic capacitor element are supplied as the voltage Vpp. In the configuration disclosed in this Patent Document 1, however, when the high voltage Vpp is reduced to be lower than the threshold value, switchover to the second boost circuit that generates Vpp+α is just performed. Incidentally, in the case of a flash memory, the boosted voltage or the gate voltage of the EEPROM of VPP+α will also become a factor for accelerating a read disturb (that induces software writing) in a read mode.

[Patent Document 1]

JP Patent Kokai Publication No. JP-P-2000-268562 A (p3, FIG. 1)

SUMMARY OF THE DISCLOSURE

As described above, in the configuration shown in FIG. 7, when the resistances of the resistors $202_1$ and $202_2$ are set to be low, current consumption at the time of the standby increases. On the other hand, when the resistances of resistors $202_1$ and $202_2$ are set to be high, the current consumption at the time of the standby is reduced. However, there is a problem that the response at the time of the switchover from the standby state to the read operation is delayed, and a drop of or a variation in the electric potential at the word line driving power supply line thereby increases.

Then, as a compromise plan, use of a configuration as shown in FIG. 8, for example, can also be conceived. FIG. 8 is a diagram for explaining one of representative compromise plans conceived. In this configuration, a switch 205 is provided between the word line driving power supply line 22 and the resistor $202_1$, a switch 206 is provided between the word line driving power supply line 22 and a resistor $207_1$, and the resistances of the resistors $202_1$ and $202_2$ are set to be high, while the resistances of the resistor $207_1$ and a resistor $207_2$ are set to be low. The switch 205 is turned on when a standby/read switching signal for controlling switching between the standby state and the read operation indicates the standby state. The switch 205 is turned off when the standby/read signal indicates the read operation. The switch 206 is controlled to be turned on and off according to a signal obtained by inverting the standby/read switching signal by an inverter 208. The switch 206 is turned on when the standby/read switching signal indicates the read operation, while when the standby/read switching signal indicates the standby state, the switch 206 is turned off. As the resistors for supplying a divided voltage to the comparison circuit 203, a pair of the resistors $202_1$ and $202_2$ is selected by the switch 205 in an on state at the time of the standby state, while at the time of the read operation, a pair of the resistors $207_1$ and $207_2$ having the low resistances is selected by the switch 206 in the on state. Then, at the time of the standby state, the divided voltage using the resistors $202_1$ and $202_2$ is selected by the switch 209 for supply to the comparison circuit 203. At the time of the read operation, the divided voltage using the resistors $207_1$ and $202_2$ is selected by the switch 209 for supply to the comparison circuit 203.

However, when the configuration as shown in FIG. 8 is employed to classify the operations of holding the boosted voltage at the times of the standby and the read into two modes, there is a problem that a control variation at the time of switchover from the standby state to the read operation is increased.

FIG. 9 is a diagram for explaining this problem, and is based on the result of study and consideration by the inventor of the present application. FIG. 9 will be also used as a comparative example compared with the embodiment of the present invention.

When a chip enable signal CEB input from the outside of the EEPROM is activated (becomes active low) at the time of the standby state and then switchover to the read operation is performed, electric charge are lost from the stabilizing capacitor 21 (refer to FIG. 6) one by one for each operation of driving a word line by the word driver connected to the selected word line at the time of the read operation, due to a delay in the response of the boost circuit 20 (refer to FIG. 6). A temporal variation in a voltage boosting operation for compensating for this is also generated. As a result, a variation in the voltage Vword of the word line driving power supply line 22 at the time of a read operation will increase.

Referring to the example shown in FIG. 9, the voltage boosting operation of the boost circuit 20 is not adequately performed from a time ta when switchover from the standby state to the read operation is performed to a time tb. Thus, the peak value of the electric potential Vword at the word line driving power supply line 22 is reduced one by one for each read operation. With regard to the variation in the boosted potential, even when the resistors for the comparison circuit 203 in FIG. 8 has been switched from the resistors $202_1$ to $202_2$ with the high resistances to the resistors $207_1$ and $207_2$ with the low resistances to reduce the CR time constant due to the switchover from the standby state to the read operation, for example, such a variation in the output potential of the boost circuit 20 is more increased if the operation of the boost circuit 20 is delayed due to a temporal oscillation variation in the oscillator 204 or the like.

Incidentally, after the time tb in FIG. 9, the voltage boosting circuit 20 operates, so that the peak potential of the word line driving power supply potential Vword starts to increase one by one. In FIG. 9, though it is drawn so that after the chip enable signal CEB has been activated and then after five read operation cycles (five changes in the X address) have passed, the voltage boosting operation starts, such setting is employed just for the purpose of description.

A great reduction in the read-time boosted voltage at the time of switchover from the standby state to the read operation as shown in FIG. 9 also becomes a cause for an error during data reading or the like.

A power supply circuit according to one aspect of the present invention includes: a boost circuit for outputting a first electric potential; a capacitor for storing the output potential of the boost circuit; a circuit for outputting a second potential different from the first electric potential; a switch being turned on at the time of a standby, for outputting the second potential to an output terminal, and being turned off at the time of an operation, based on a standby control signal; and an amplifier circuit being deactivated at the time of the standby and being activated at the time of the operation based on the standby control signal, the amplifier circuit being for receiving the first electric potential output from the boost circuit as a driving power supply potential, driving the output terminal by the second potential, and outputting the second potential at the time of the operation.

In the present invention, the second potential preferably is lower than the first electric potential, the circuit for outputting the second potential voltage divides the first electric potential output from the boost circuit for output of the second potential, or other boost circuit is provided as the circuit for outputting the second potential, and the other boost circuit generates the second potential by boosting.

A power supply circuit according to one aspect of the present invention includes: a boost circuit for outputting a first electric potential; a voltage divider circuit for generating a second potential obtained by voltage dividing the first electric potential output from the boost circuit; a power supply line connected to a stabilizing capacitor and also connected to one or a plurality of load circuits targeted for electric supply; an auxiliary capacitor for storing the output potential of the boost circuit; a switch connected between the output of the voltage divider circuit and the power supply line, the switch being turned on when a standby control signal indicates a standby state and being turned off when the standby control signal indicates an operation state; and an amplifier circuit receiving the second potential as an input potential, having an output connected to the power supply line, and receiving the first electric potential from the boost circuit as a driving power supply potential, the amplifier circuit being deactivated when the standby control signal indicates the standby state, the amplifier being activated when the standby control signal indicates the operation state, for driving the power supply line by the second potential; electric charge lost during transition from the standby state to the operation state being supplied from the auxiliary capacitor.

A power supply circuit according to another aspect of the present invention includes: a first boost circuit for outputting a first electric potential; an auxiliary capacitor for storing the output potential of the first boost circuit; a second boost circuit for outputting a second potential lower than the first electric potential; a power supply line connected to a stabilizing capacitor and also connected to one or a plurality of load circuits targeted for electric supply; a switch connected between the output of the second boost circuit and the power supply line, the switch being turned on when a standby control signal indicates a standby state and being turned off when the standby control signal indicates an operation state; and an amplifier circuit receiving the second potential from the second boost circuit as an input, having the output of the amplifier circuit connected to the power supply line, and receiving the first electric potential from the boost circuit as a driving power supply potential, the amplifier circuit being deactivated when the standby control signal indicates the standby state, the amplifier being activated when the standby control signal indicates the operation state, for driving the power supply line by the second potential; electric charge lost during transition from the standby state to the operation state being supplied from the auxiliary capacitor.

A semiconductor storage device according to one aspect of the present invention includes: a boost circuit for receiving a power supply potential given from the outside of the semiconductor storage device and boosting the supply potential, thereby outputting a first electric potential; a capacitor for storing the electric potential output from the boost circuit; a circuit for outputting a second potential different from the first electric potential; a switch being turned on at the time of a standby state, for outputting the second potential to a power supply line for a circuit for driving a word line (referred to as a "word line driving power supply line"), and being turned off at the time of an access operation, based on an input standby/access switching signal; and an amplifier circuit being deactivated at the time of the standby and being activated at the time of the access operation, based on the standby/access switching signal, the amplifier circuit being for receiving the first electric potential output from the boost circuit as a driving power supply potential, driving the word line driving power supply line by the second potential, and outputting the second potential at the time of the access operation. In the present invention, the second potential is set to be lower than the first electric potential, and the circuit for outputting the second potential is configured to voltage divide the first electric potential output from the boost circuit, thereby outputting the second potential. Alternatively, the second potential is generated using a different boost circuit.

A semiconductor storage device according to other aspect of the present invention includes: a boost circuit for receiving a power supply potential given from the outside of the semiconductor storage device and boosting the supply potential, thereby outputting a first electric potential; a voltage divider circuit for generating a second potential obtained by dividing the first electric potential output from the boost circuit; a word line driving power supply line connected to a stabilizing capacitor, the word line driving power supply line being also for supplying driving power to a circuit for driving a word line; an auxiliary capacitor for storing the electric potential output from the boost circuit; a switch connected between the output of the voltage divider circuit and the word line driving power supply line, the switch being turned on when an input standby/access switching signal indicates a standby state and being turned off when the standby/access switching signal indicates an access operation; and an amplifier circuit receiving the second potential as an input potential, having an output connected to the word line driving power supply line, and receiving the first electric potential from the boost circuit as a driving power supply potential, the amplifier circuit being deactivated when the standby control signal indicates the standby state, the amplifier circuit being activated when the standby control signal indicates the access operation, for driving the power supply line by the second potential.

A semiconductor storage device according to other aspect of the present invention includes: a first boost circuit for receiving a power supply potential given from the outside of the semiconductor storage device and boosting the supply potential, thereby outputting a first electric potential; a second boost circuit for outputting a second potential lower than the first electric potential; an auxiliary capacitor for storing the electric potential output from the first boost circuit; a word line driving power supply line connected to a stabilizing capacitor, the word line driving power supply line being also for supplying driving power to a circuit for driving a word line; a switch connected between the output of the second boost circuit and the word line driving power supply line, the switch being turned on when an input standby/access switching signal indicates a standby state and being turned off when the standby/access switching signal indicates an access operation; and an amplifier circuit receiving the second potential from the second boost circuit as an input, having an output connected to the power supply line, and receiving the first electric potential from the boost circuit as a driving power supply potential, the amplifier circuit being deactivated when the standby/access switching signal indicates the standby state, the amplifier circuit being activated when the standby/access switching signal indicates the operation state, for driving the power supply line by the second potential.

The meritorious effects of the present invention are summarized as follows.

According to the present invention, a variation in a boosted potential supplied to a power supply line at the time of switchover from a standby to an operation can be suppressed while achieving reduction in power consumption of a boost circuit at the time of the standby.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
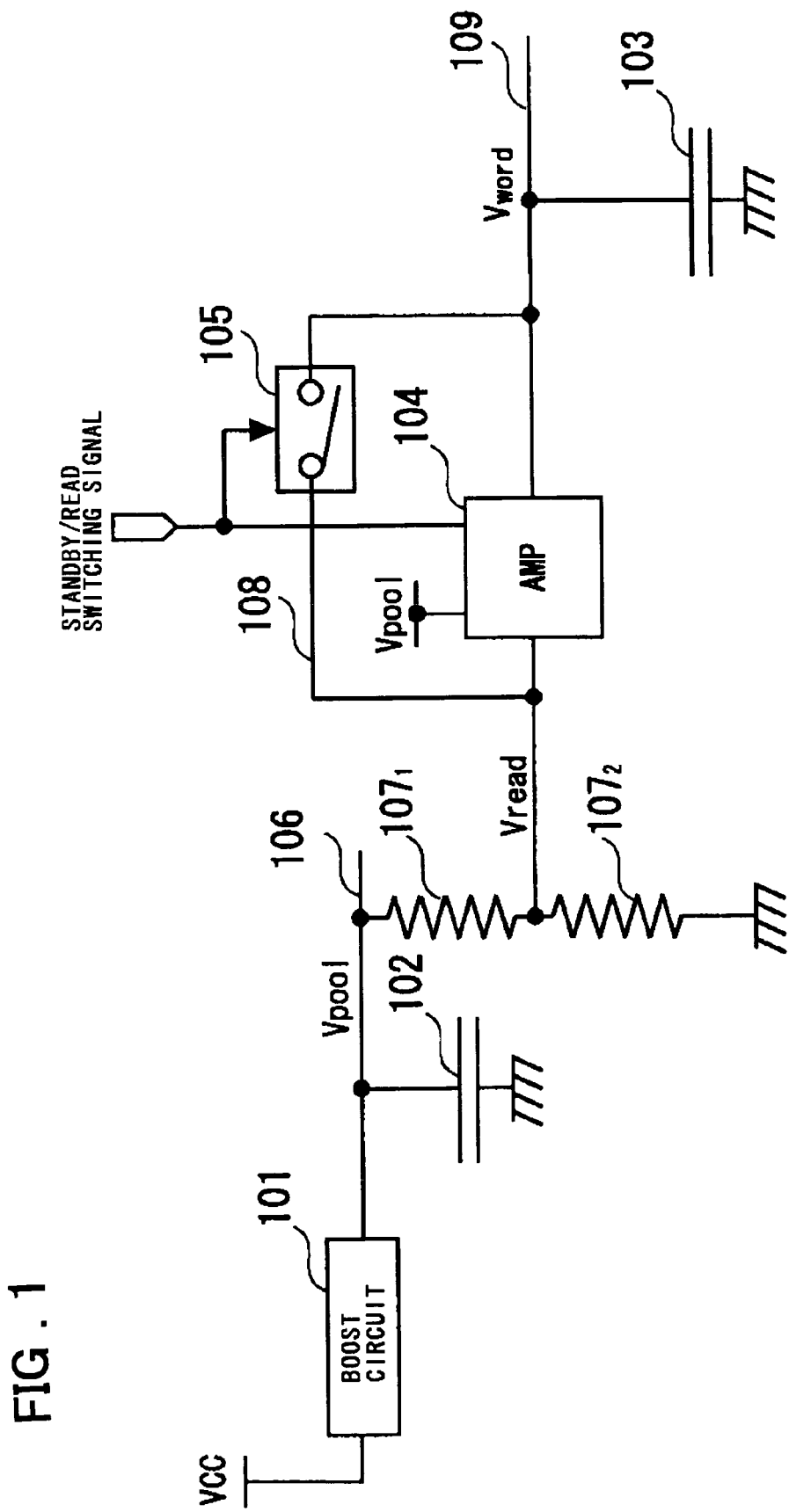
FIG. 1 is a diagram showing a configuration of a first embodiment of the present invention.

In order to describe the present invention in further detail, embodiments of the present invention will be described below with reference to the accompanying drawings. FIG. 1 is a diagram showing a configuration of a first embodiment of the present invention.

Referring to FIG. 1, a semiconductor storage device according to the first embodiment of the present invention is the semiconductor storage device for driving a word line by a voltage higher than an external supply voltage Vcc (such as 1.8V). The semiconductor storage device includes a boost circuit 101, an auxiliary capacitor 102, voltage-dividing resistors $107_1$ and $107_2$, an amplifier (AMP) circuit 104, and a switch 105. The boost circuit 101 receives the external supply voltage Vcc and outputs a boosted potential Vpool (such as 7V) higher than the external power supply voltage Vcc. One terminal of the auxiliary capacitor 102 is connected to an output node 106 of the boost circuit 101, and the other terminal of the auxiliary capacitor 102 is connected to a ground potential, for example. The voltage-dividing resistors $107_1$ and $107_2$ are connected between the output node 106 of the boost circuit 101 and a ground, for outputting a voltage (such as 6V) obtained by voltage-dividing the boosted voltage Vpool of the boost circuit 101 from a tap. The input terminal of the amplifier circuit 104 is connected to the connecting point (tap) between the voltage-dividing resistors $107_1$ and $107_2$, and the amplifier circuit 104 receives the boosted voltage Vpool as the driving power supply potential. Activation/deactivation of the amplifier circuit 104 is controlled by a standby/read switching signal. One terminal of the switch 105 is connected to the connecting point between the voltage-dividing resistors $107_1$ and $107_2$, and the other terminal is connected to a word line driving power supply line 109, and the switch 105 is controlled to be turned on or off according to the standby/read switching signal. The word line driving power supply line 109 is connected to the output terminal of the amplifier circuit 104, and is also connected to one terminal of the stabilizing capacitor 103 which has the other terminal connected to the ground. The word line driving power supply line 109 is connected to the power supply pad of a word driver (that receives the output of an X decoder, for driving the word line) not shown.

The amplifier circuit 104 is deactivated (with its operation stopped) at the time of a standby according to the standby/read switching signal, and the output of the amplifier circuit 104 is brought to a high impedance state. At the time of a read operation, the amplifier circuit 104 is controlled to be switched to an activation state.

The switch 105 which receives the standby/read switching signal, is turned on at the time of the standby and is turned off at the time of the read operation, according to the standby/read switching signal. The standby/read switching signal is a control signal generated inside the semiconductor storage device based on a chip enable signal CEB input to a control terminal (CEB) from an outside of the semiconductor storage device.

Figure 2:
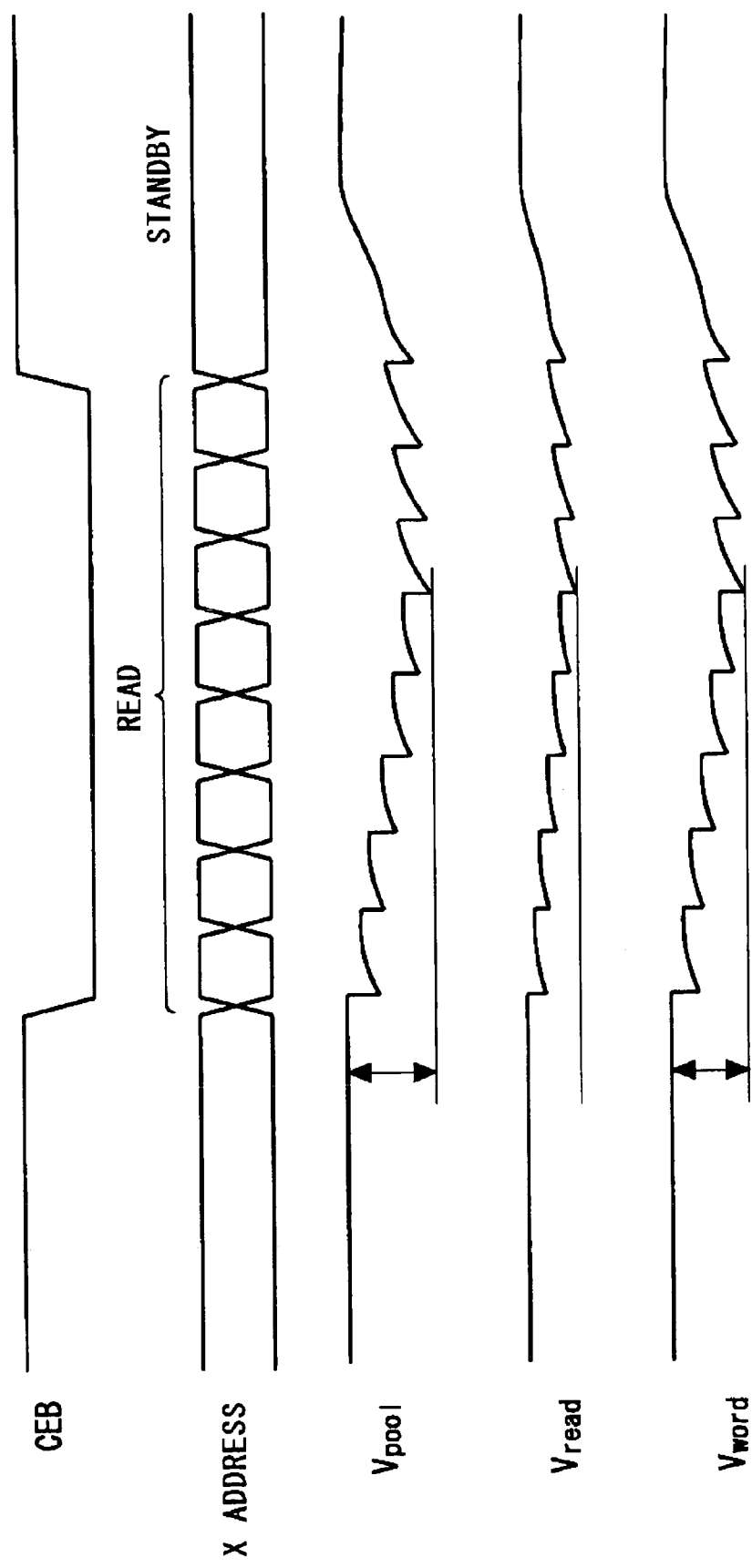
FIG. 2 is a timing waveform diagram for explaining an example of an operation of the first embodiment of the present invention.

FIG. 2 is a timing waveform diagram for explaining an operation of the present embodiment shown in FIG. 1. FIG. 2 schematically shows an example of transitions of waveforms of the chip enable signal CEB input to the control terminal (CEB) from the outside of the semiconductor storage device, X address, Vpool (which is the electric potential at a node 106), Vread (which is the electric potential at a node 108), and Vword (which is the electric potential at the word line driving power supply line 109). Referring to FIGS. 1 and 2, the operation of the first embodiment will be described below.

When the chip enable signal CEB is deactivated (high), the standby/read switching signal is brought to a standby state, so that the amplifier circuit 104 is deactivated, and its output is brought to the high impedance state. On the other hand, the switch 105 is turned on. Accordingly, in the standby state, the voltage Vread (such as 6V) obtained by voltage-dividing the boosted voltage Vpool of the boost circuit 101 by the resistors $107_1$ and $107_2$ is supplied to the word line driving power supply line 109 through the switch 105 in an on state. The electric potential of the word line driving power supply line 109 thereby is set to the voltage Vread.

When the chip enable signal CEB is activated (low) and the read operation is then performed, the switch 105 is turned off, and the amplifier circuit 104 is activated. The amplifier circuit 104 receives the voltage Vread obtained by voltage-dividing the boosted voltage Vpool by the resistors $107_1$ and $107_2$, and drives the word line driving power supply line 109 to the voltage Vread.

Preferably, the amplifier circuit 104 has a voltage follower configuration, and the voltage Vword of the word line driving power supply line 109 is made to be in phase with the input voltage Vread to the amplifier circuit 104. At the time of the read operation, the voltage Vread (which is the electric potential at the node 108 in FIG. 1) obtained by voltage-dividing the boosted voltage Vpool by the resistors $107_1$ and $107_2$ is made to be in phase with the boosted voltage Vpool, and the voltage Vword of the word line driving power supply line 109 driven by the amplifier circuit 104 is also made to be in phase with the Vpool.

In the present embodiment, at the time of switching from the standby state to the read operation, electric charge for the read operation is supplied from the auxiliary capacitor 102 in which the electric charge have been stored at the time of the standby. For this reason, a variation in the voltage Vword of the word line driving power supply line 109 at the time of the switching from the standby state to the read operation is suppressed and reduced more than in the case of a comparative example shown in FIG. 9.

Figure 9:
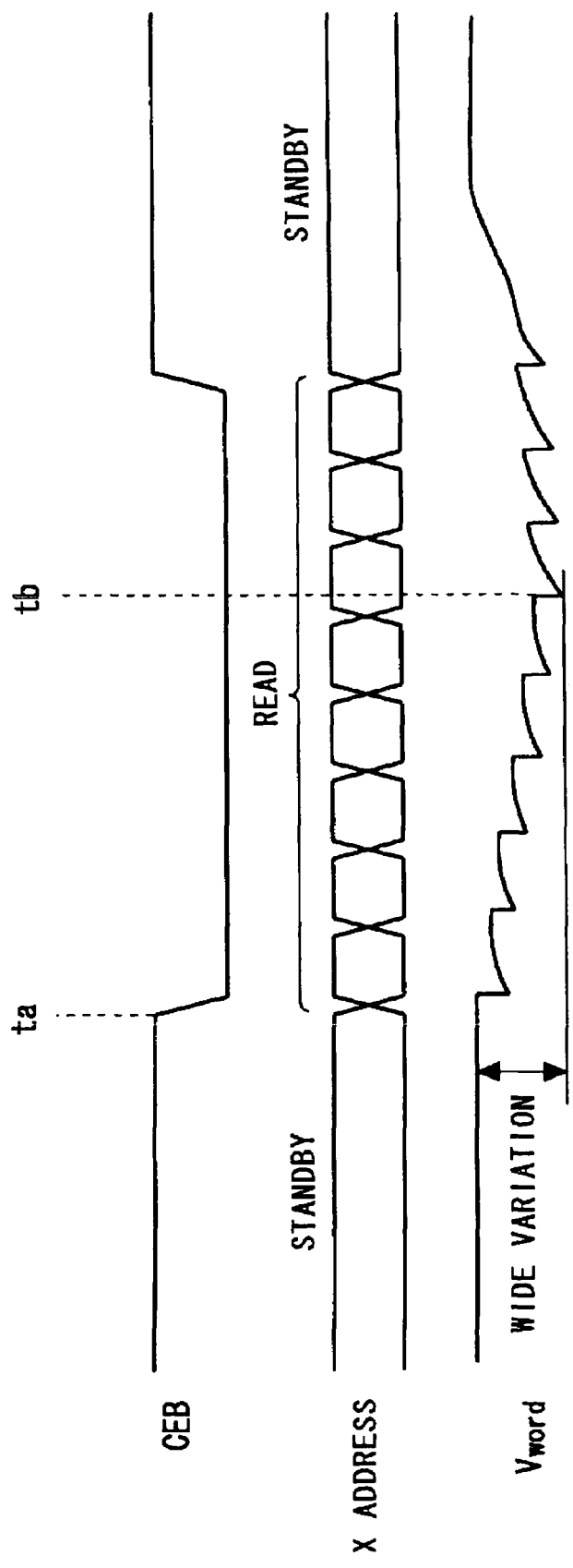
FIG. 9 is a waveform diagram for explaining an operation in FIG. 6.

More specifically, though the peak level of the boosted voltage Vpool output from the boost circuit 101 is lowered one by one for each electric charge loss, the width of the variation in the fall in the electric potential of the word line driving power supply line 109 is smaller than that in the example shown in FIG. 9, by the amount of supply of the electric charge from the auxiliary capacitor 102 at the time of the switching from the standby state to the read operation.

Referring to FIG. 1, it may be of course so configured that the resistors $107_1$ and $107_2$ for generating Vread are constituted from the resistors with high resistances, thereby achieving reduction in power consumption both at the times of the standby and the read operation.

Figure 3:
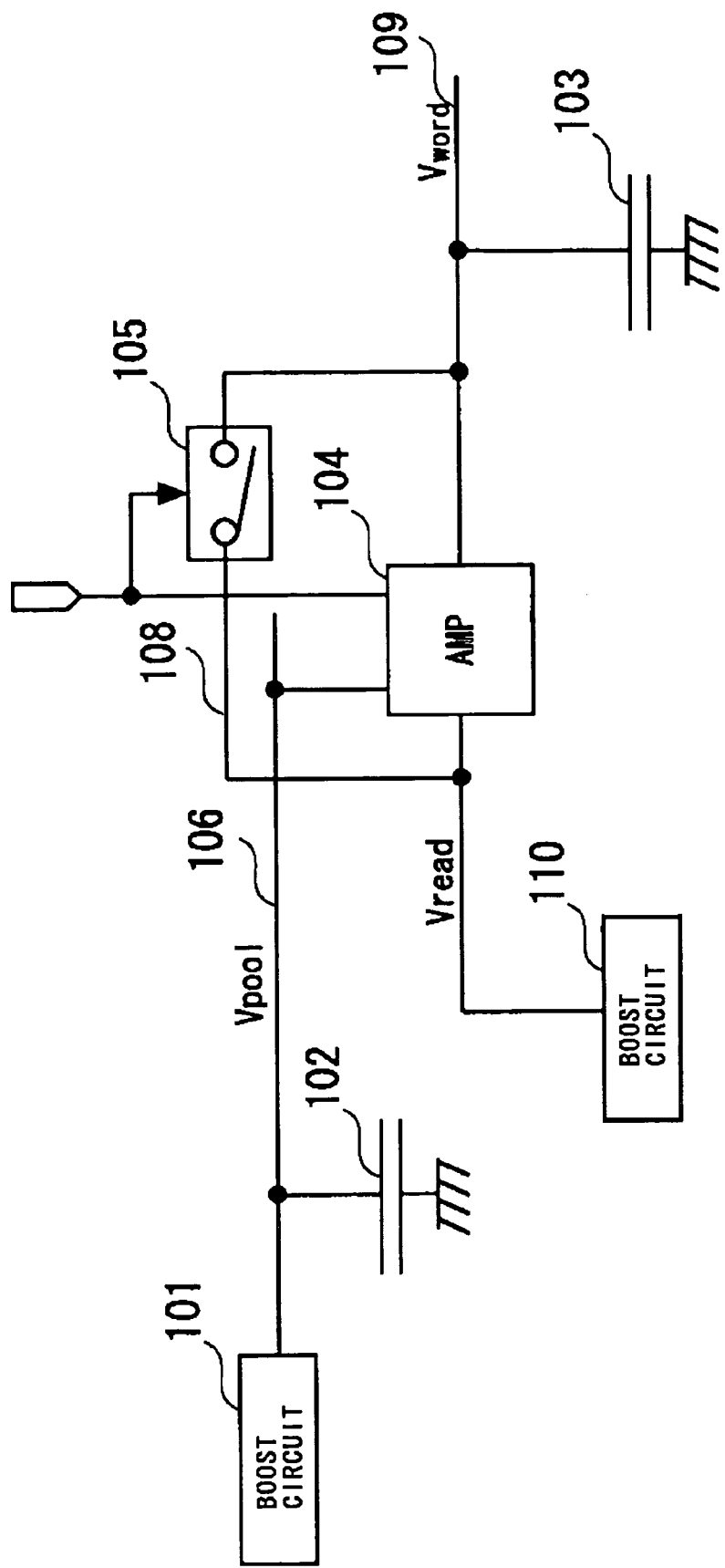
FIG. 3 is a diagram showing a configuration of a second embodiment of the present invention.

Next, a configuration of a second embodiment of the present invention will be described. FIG. 3 is a diagram showing a configuration of the second embodiment of the present invention. Referring to FIG. 3, a semiconductor storage device according to the second embodiment of the present invention includes the boost circuit 101, the auxiliary capacitor 102, and a boost circuit 110. The boost circuit 101 inputs an external supply voltage Vcc (such as 1.8V) not shown, and outputs the boosted voltage Vpool (such as 7V) that is higher than Vcc. One terminal of the auxiliary capacitor 102 is connected to the output node 106 of the boost circuit 101, and the other terminal of the auxiliary capacitor 102 is connected to ground. The boost circuit 110 outputs the boosted voltage Vread (such as 6V), which is higher than Vcc. Meanwhile, Vread is set to be lower than Vpool.

The output voltage Vread of the boost circuit 110 is supplied to the input terminal of the amplifier circuit 104 and is also supplied to one terminal of the switch 105 which is controlled to be turned on and off according to the value of the standby/read switching signal. The other terminal of the switch 105 is connected to the word line driving power supply line 109, and the output terminal of the amplifier circuit 104 is connected to the word line driving power supply line 109. As in the first embodiment described above, in the present embodiment as well, the stabilizing capacitor 103 is connected to the word line driving power supply line 109.

As in the first embodiment, in the second embodiment as well, the amplifier circuit 104 is deactivated at the time of the standby, according to the standby/read switching signal. The output terminal of the amplifier circuit 104 is brought to the high impedance state. The amplifier circuit 104 is activated at the time of the read operation.

Further, the switch 105 is turned on at the time of the standby and turned off at the time of the read operation, according to the standby/read switching signal. The standby/read switching signal is the control signal generated inside the semiconductor storage device based on the chip enable signal CEB input to the control terminal (pin) from the outside of the semiconductor storage device.

Figure 4:
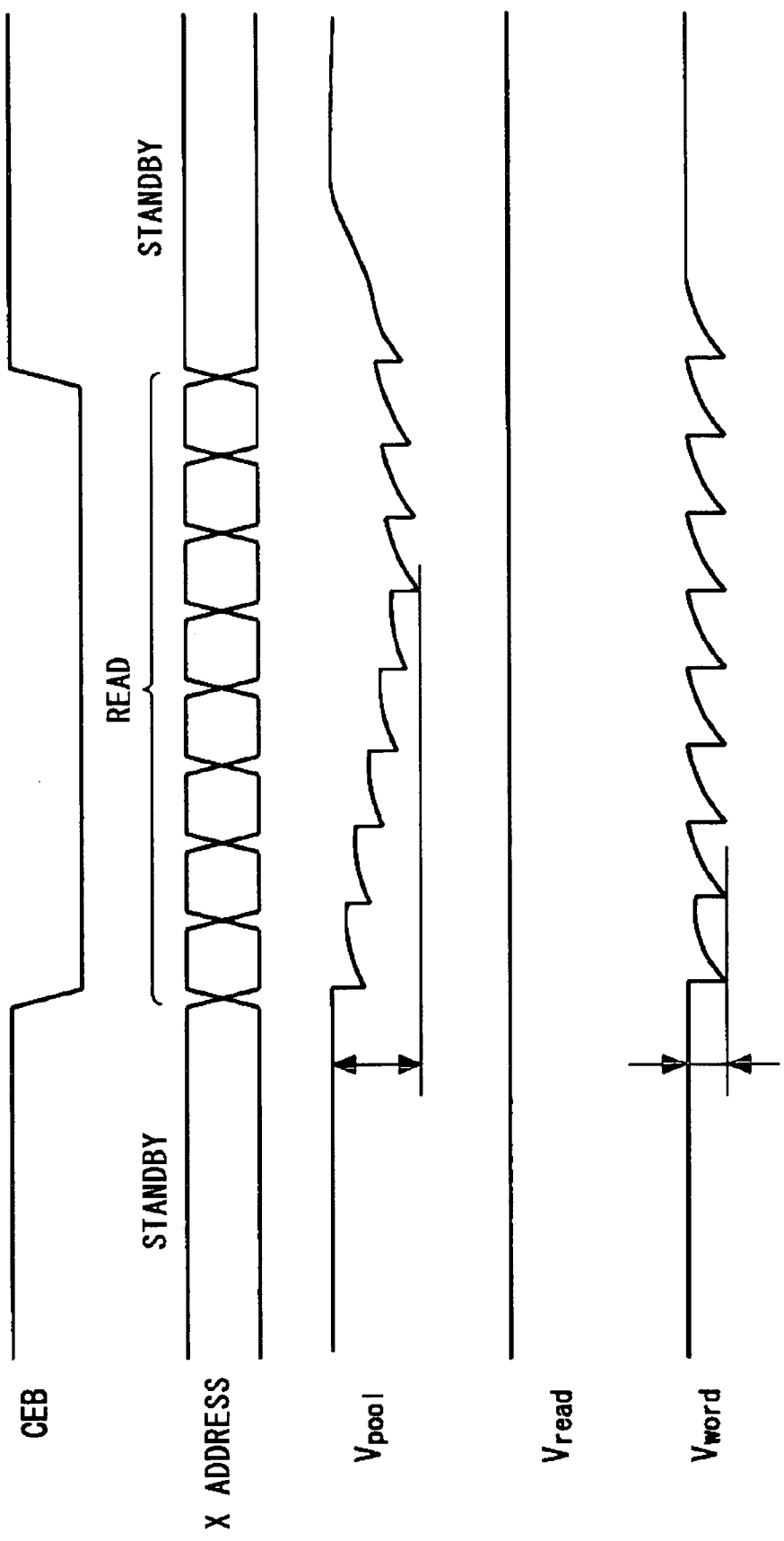
FIG. 4 is a timing diagram for explaining an example of an operation of the second embodiment of the present invention.

FIG. 4 is a timing waveform diagram for explaining an operation of the present embodiment shown in FIG. 3. FIG. 4 schematically shows an example of transitions of waveforms of the chip enable signal CEB input to the control terminal (CEB) from the outside of the semiconductor storage device, X address, Vpool (which is the electric potential at the node 106), Vread (which the electric potential at the node 108), and Vword (which is the electric potential at the word line driving power supply line 109). Referring to FIGS. 3 and 4, the operation of the second embodiment will be described below.

When the chip enable signal CEB is deactivated (high), the standby/read switching signal is brought to the standby state, so that the amplifier circuit 104 is deactivated, and its output is brought to the high impedance state. The switch 105 is turned on. Accordingly, in the standby state, the voltage Vread from the boost circuit 110 is supplied to the word line driving power supply line 109 through the switch 105.

When the chip enable signal CEB is activated (low) and the standby/read switching signal indicates the read operation, the switch 105 is turned off, and the amplifier circuit 104 is activated. The amplifier circuit 104 receives the output voltage Vread at the input terminal thereof, and drives the word line driving power supply line 109 by the electric potential Vread.

Being different from the first embodiment, in the second embodiment, the output voltage Vread (which is the electric potential at the node 108) of the boost circuit 110 is kept to be constant even at the time of the read operation. This is because the output of the boost circuit 110 is connected to the amplifier circuit 104 with the high input impedance, and the switch 105 is turned off at the time of the read operation, so that the electric charge of the output voltage Vread (at the node 108) are not lost.

The amplifier circuit 104 has the voltage follower configuration in which an output terminal thereof is driven by the same voltage as an input voltage. Since the electric charge at the time of the read operation are supplied from the auxiliary capacitor 102 in which electric charge are accumulated at the time of the standby, a variation in the electric potential Vword of the word line driving power supply line 109 at the time of the switching from the standby state to the read operation is particularly reduced, compared with the conventional case shown in FIG. 9.

Further, the amplifier circuit 104 drives the word line driving power supply line 109 with the voltage Vread. For this reason, though the peak level of the boosted voltage Vpool output from the boost circuit 101 is lowered one by one for each electric charge loss caused by the read operation, the peak value of the electric potential of the word line driving power supply line 109 is returned to 6V (Vread) for each read cycle. More specifically, the peak value is maintained to be 6V. For this reason, the word line power supply of 6V is supplied to the word line of a selected cell, so that the read operation is stabilized.

Figure 5:
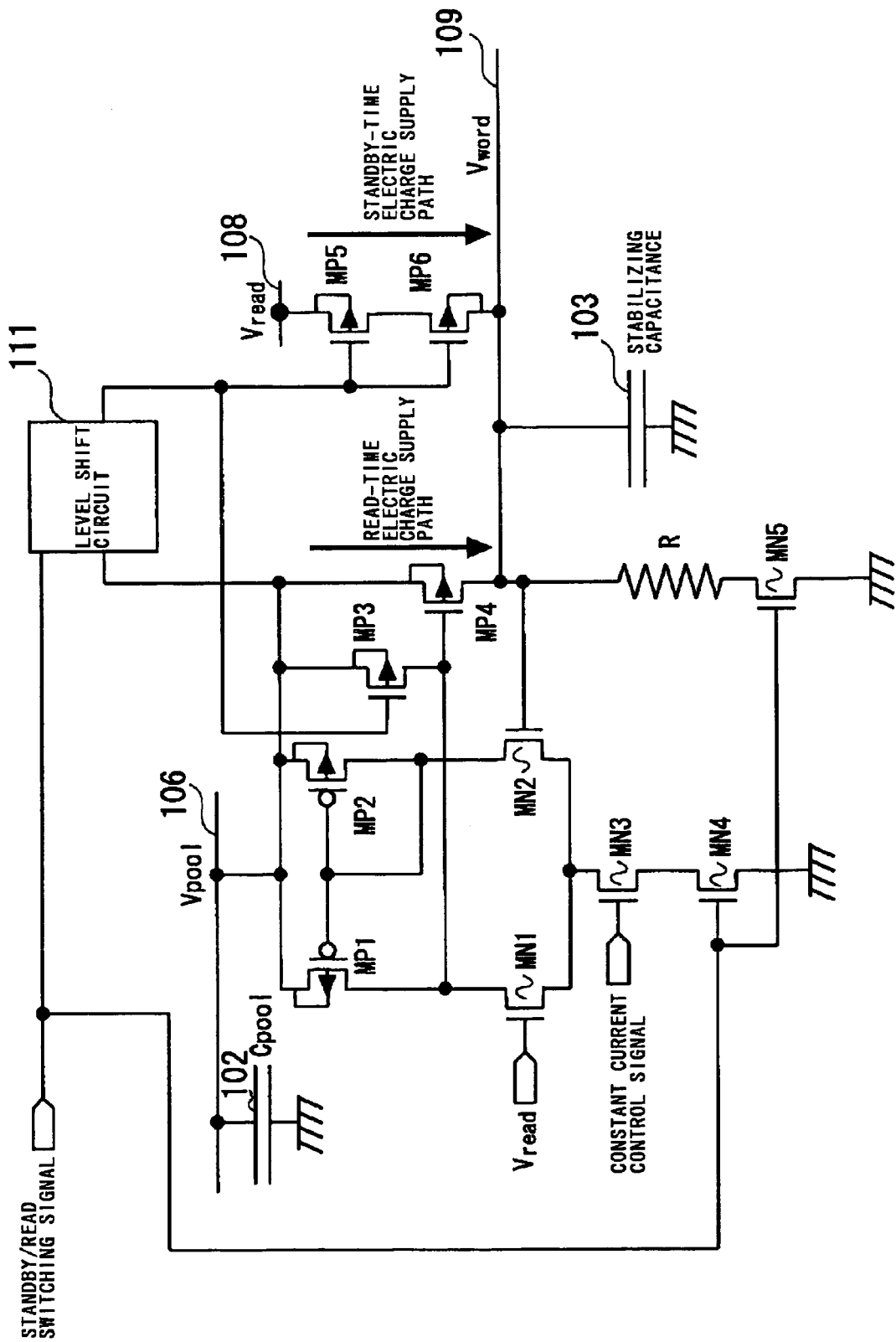
FIG. 5 is a diagram showing an embodiment of an amplifier circuit and a switch according to the present invention.
Figure 6:
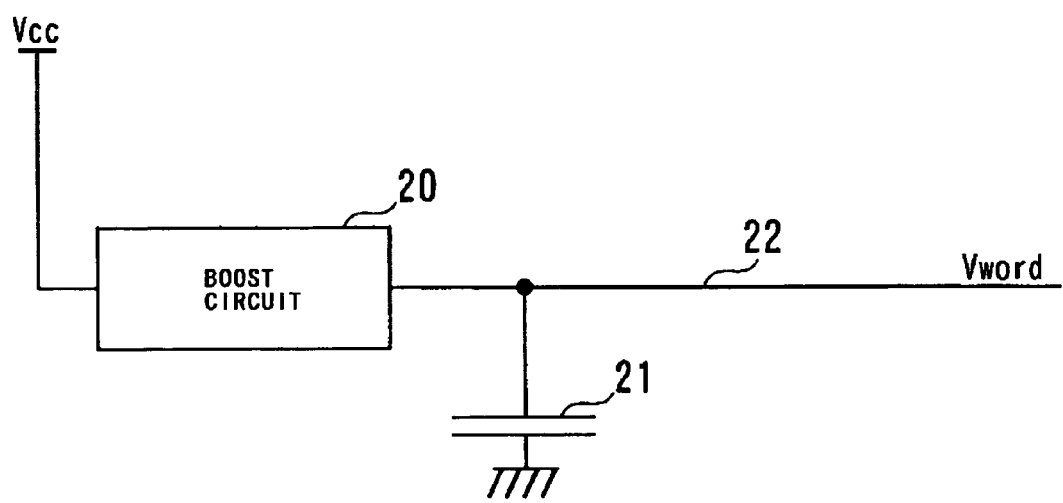
FIG. 6 is a diagram showing a configuration of a conventional power supply circuit for supplying a power supply to a word line.
Figure 7:
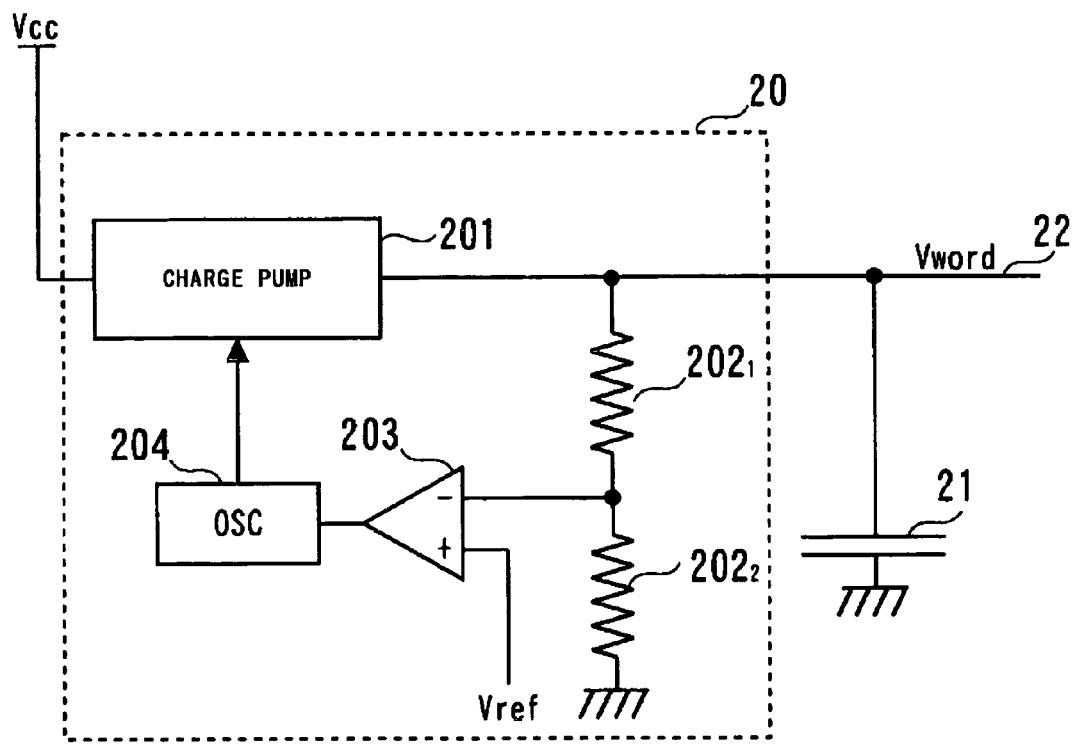
FIG. 7 is a diagram for explaining a boost circuit.

FIG. 5 is a diagram showing an example of a configuration of the amplifier circuit 104 and the switch 105 in the embodiment shown in FIGS. 1 and 3.

Referring to FIG. 5, the amplifier circuit 104 is constituted from a differential amplifier circuit, and includes an NMOS transistor MN3 that constitutes a constant current source for supplying a constant current to a differential pair, NMOS transistors MN3, and MN2 that constitute the differential pair with sources thereof connected in common to a drain of the NMOS transistor MN3, and a current mirror circuit (constituted from PMOS transistors MP1 and MP2) that constitutes an active load for the differential pair. Sources of the PMOS transistors MP1 and MP2 that constitute the current mirror are connected to the electric potential Vpool (the node 106 in FIG. 1 or FIG. 3). The NMOS transistor MN3 has its source connected to a drain of the NMOS transistor MN4 which has is source connected to the ground and has its gate for receiving the standby/read switching signal as an input.

An output of the differential pair (the connecting point between drains of the transistor MN1 and the transistor MP1) is connected to a gate of a PMOS transistor MP4 which has its source connected to the Vpool (at the node 106) and has its drain connected to the word line driving power supply line 109. The PMOS transistor MP4 constitutes an output amplification stage.

The connecting point between the drain of the PMOS transistor MP4 and the word line driving power supply line 109 is connected to a drain of an NMOS transistor MN5 through a resistance R. The NMOS transistor MN5 has its source connected to the ground, and has its gate connected to the standby/read switching signal.

The standby/read switching signal is supplied to a level shift circuit 111 for a level shift. There is provided a PMOS transistor MP3 which has a gate supplied with the level-shifted standby/read switching signal output from the level shift circuit 111. The source of the PMOS transistor MP3 is connected to the Vpool (at the node 106), and the drain of the PMOS transistor MP3 is connected to the gate of the PMOS transistor MP4 in the output amplification stage.

Further, PMOS transistors MP5 and MP6 are provided. The PMOS transistor MP5 has its source connected to the Vread (at the node 108 in FIG. 1 or FIG. 3) and has its gate supplied with the level shifted standby/read switching signal. The PMOS transistor MP6 has its source connected to the word line driving power supply line 109, has its gate supplied with the level shifted standby/read switching signal, and has its drain connected to the drain of the PMOS transistor MP5.

The gate (non-inverting input terminal) of the NMOS transistor MN1 of the differential pair receives the voltage Vread, and the output terminal of the differential amplifier circuit (the word line driving power supply line 109 in FIG. 5) is connected to the gate (inverting input terminal) of the NMOS transistor MN2 of the differential pair, thereby constituting a voltage follower amplifier.

Further, the PMOS transistors MP3, MP5, and MP6 constitute the switch 105 in FIG. 1 and in FIG. 3.

The level shift circuit 111 level shifts the standby/read switching signal for controlling switching on and off of the PMOS transistors MP3, MP5 and MP6 to the signal of an amplitude suitable for the boosted voltage Vpool and the Vread. When the PMOS transistors MP3, MP5, and MP6 are switched off, the electric potential of the standby/read switching signal supplied to the gates of the PMOS transistors MP3, MP5, and MP6 is set to the Vread. On the other hand, when the PMOS transistors MP3, MP5, and MP6 are switched on, the electric potential of the standby/read switching signal supplied to the gates of the PMOS transistors MP3, MP5, and MP6 is set to the ground potential. The PMOS transistors MP5 and MP6 vertically stacked (cascode connected) between the Vread and the word line driving power supply line 109 block back-flow of the current from the word line driving power supply line 109 to the Vread (at the node 108).

An operation of the differential amplifier circuit shown in FIG. 5 will be described below.

In the present embodiment, in the standby state, the standby/read switching signal is made to be low, so that the constant current source NMOS transistor MN4 and the NMOS transistor MN5 in the output amplification stage are both turned off. Then, since the standby/read switching signal is made to be low, the PMOS transistor MP3 is turned on, and the gate of the PMOS transistor MP4 is brought to the electric potential Vpool. For this reason, the PMOS transistor MP4 in the output amplification stage is turned off, and the output of the differential amplifier circuit is brought to the high impedance state. On the other hand, the PMOS transistors MP5 and MP6 are turned on. Thus, the voltage Vread (6V) at the node 108 in FIG. 1 or FIG. 3 is supplied to the word line driving power supply line 109.

As described above, according to the present embodiment, in the standby state, a power supply current path in the amplifier circuit 104 is shut down, so that the operation of the amplifier circuit 104 is stopped. Power dissipation is thereby reduced.

In the present embodiment, at the time of the read operation, the standby/read switching signal is made to be high, so that the constant current source NMOS transistor MN4 and the NMOS transistor MN5 in the output amplification stage are turned on. The differential amplifier circuit is thereby activated. Further, the PMOS transistors MP3, MP5, and MP6 are turned off, and the PMOS transistor MP4 in the output amplification stage receives the output of the differential pair (constituted from the MN1 and the MN2) at the gate thereof and drives to charge the word line driving power supply line 109. Meanwhile, when the standby/read switching signal is high, the NMOS transistor MN5, which is connected to the word line driving power supply line 109 via the resistor R drives to discharge the word line driving power supply line 109. When the electric potential of the inverting input terminal (the gate of the NMOS transistor MN2) of the differential pair (constituted from the MN1 and the MN2) becomes lower than the electric potential Vread, the current (drain-source current) that flows through the NMOS transistor MN2, which is one of the differential pair, is temporarily reduced, so that the current (drain-source current) that flows through the NMOS transistor MN1, which is the other of the differential pair, is increased. Then, the gate potential of the PMOS transistor MP3 is reduced, so that the current (drain-source current) which flows through the PMOS transistor MP3 is increased. The electric potential of the word line driving power supply line 109 is thereby increased. On the other hand, when the electric potential of the inverting input terminal (the gate of the NMOS transistor MN2) of the differential pair (constituted from the MN1 and the MN2) becomes higher than the electric potential Vread, the current (drain-source current) which flows through the NMOS transistor MN2, which is one of the differential pair, is temporarily increased, and the current (drain-source current) that flows through the NMOS transistor MN1, which is the other of the differential pair, is reduced. The gate potential of the PMOS transistor MP3 is increased, so that the current (drain-source current) which flows through the PMOS transistor MP3 is reduced. The electric potential of the word line driving power supply line 109 is thereby reduced. As described above, the differential amplifier circuit in FIG. 5 functions as a voltage follower circuit for driving the word line driving power supply line 109 by the voltage of the same phase as the phase of the electric potential Vread input to the noninverting input terminal. Meanwhile, a capacitor (capacitance element for preventing oscillation) may be of course provided between the drain and the gate of the PMOS transistor MP4.

Figure 8:
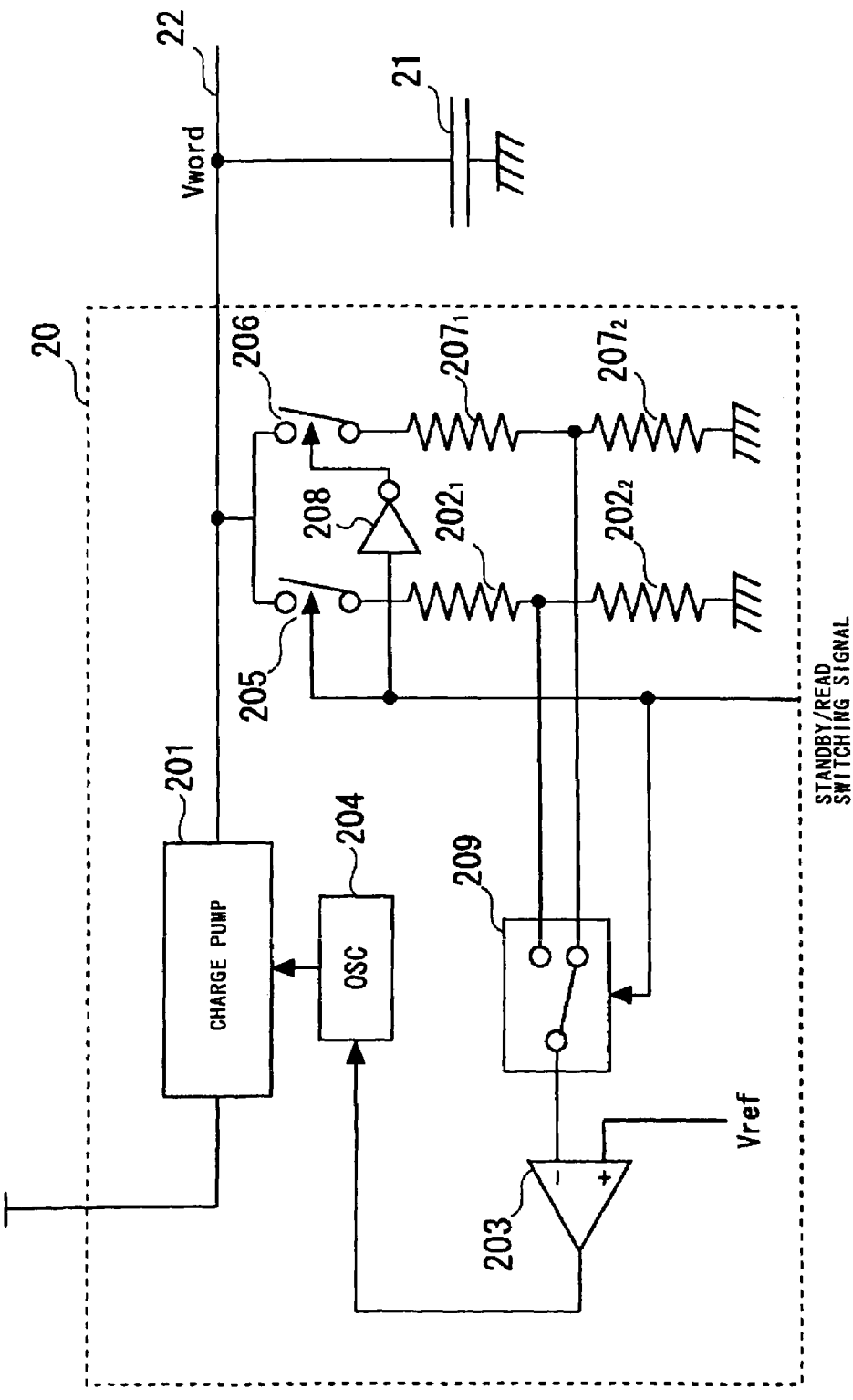
FIG. 8 is a diagram for explaining the boost circuit of a resistor switching type.

In the above-mentioned embodiment shown in FIG. 1 and the like, a configuration in which the high resistances and the low resistances are switched by using a switch according to the standby/reading switching control signal, as shown in FIG. 8, may be employed as the boost circuit 101.

The foregoing is a description about the present invention in connection with the embodiment described above. The present invention is not limited to the configuration of the above-mentioned embodiment alone, and can be applied to an arbitrary power supply circuit that performs switching between the standby state and an active state. Further, the present invention is not limited to the application to the boost circuit of the semiconductor storage device, and can be of course applied to an arbitrary electronic device.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A power supply circuit comprising:
a boost circuit for generating a boosted voltage to output a first electric potential;
a capacitor for storing the output potential of said boost circuit;
a circuit for outputting a second electric potential different from the first electric potential;
a switch controlled to be turned on at a time of a standby to output the second electric potential to an output terminal, and to be turned off at a time of an operation, responsive to a standby control signal; and
an amplifier circuit controlled to be deactivated at the time of the standby and to be activated at the time of the operation, responsive to said standby control signal, said amplifier circuit supplied with the first electric potential output from said boost circuit as a power supply electric potential and driving said output terminal with the second electric potential, at the time of the operation.

2. The power supply circuit according to claim 1, wherein the second electric potential is set to be lower than the first electric potential;
said circuit for outputting the second electric potential voltage dividing the first electric potential output from said boost circuit to output the second electric potential.

3. The power supply circuit according to claim 1, wherein the second electric potential is set to be lower than the first electric potential;
said circuit for outputting the second electric potential being constituted from another boost circuit different from said boost circuit, and said another boost circuit generating a boosted voltage to output the second electric potential.

4. The power supply circuit according to claim 1, wherein said amplifier circuit has a voltage follower configuration in which a non-inverting input terminal thereof receives the second electric potential and an inverting input terminal thereof receives an output voltage of said amplifier circuit.

5. A semiconductor device comprising the power supply circuit according to claim 1.

6. An electronic device comprising the power supply circuit according to claim 1.

7. A semiconductor storage device comprising the power supply circuit according to claim 1.

8. A semiconductor storage device according to claim 7, wherein the second electric potential is set to be lower than the first electric potential; and wherein
said circuit for outputting the second electric potential voltage divides the first electric potential output from said boost circuit to output the second electric potential.

9. The semiconductor storage device according to claim 9, wherein the second electric potential is set to be lower than the first electric potential; and wherein
said circuit for outputting the second electric potential is constituted from other boost circuit different from said boost circuit and the second electric potential is generated by said other boost circuit.

10. The semiconductor storage device according to claim 7, wherein said amplifier circuit has a voltage follower configuration in which a non-inverting input terminal thereof receives the second electric potential and an inverting input terminal thereof receives an output potential of said amplifier circuit.

11. A power supply circuit comprising:
a boost circuit for generating a boosted voltage to output a first electric potential;
a voltage dividing circuit for generating a second electric potential obtained by voltage dividing the first electric potential output from said boost circuit;
a power supply line connected to one or a plurality of load circuits to which powers are to be supplied;
a first capacitor connected to said power supply line for stabilizing an electric potential of said power supply line;
a second capacitor for storing the output potential of said boost circuit;
a switch connected between an output of said voltage dividing circuit and said power supply line, said switch receiving a standby control signal and controlled to be turned on and off, when the standby control signal indicates a standby state and an operation state, respectively; and
an amplifier circuit receiving the second electric potential as an input voltage, having an output connected to said power supply line, and receiving the first electric potential from said boost circuit as a driving power supply potential, said amplifier circuit controlled to be deactivated when the standby control signal indicates the standby state and to be activated to drive said power supply line with the second electric potential, when the standby control signal indicates the operation state;
wherein electric charge lost during transition from the standby state to the operation state is supplied from said second capacitor.

12. A semiconductor storage device comprising the power supply circuit according to claim 11.

13. A power supply circuit comprising:
a first boost circuit for generating a boosted voltage to output a first electric potential;
a power supply line connected to one or a plurality of load circuits to which powers are to be supplied;
a first capacitor connected to said power supply line for stabilizing an electric potential of said power supply line;
a second capacitor for storing the output potential of said first boost circuit;
a second boost circuit for generating a boosted voltage to output a second electric potential lower than the first electric potential;
a switch connected between an output of said second boost circuit and said power supply line, said switch receiving a standby control signal for being controlled to be turned on and off when the standby control signal indicates a standby state and an operation state respectively; and
an amplifier circuit receiving the second electric potential from said second boost circuit as an input, having an output of said amplifier circuit connected to said power supply line, and receiving the first electric potential from said boost circuit as a driving power supply potential, said amplifier circuit controlled to be deactivated when the standby control signal indicates the standby state and to activated to drive said power supply line with the second electric potential when the standby control signal indicates the operation state;

wherein electric charge lost during transition from the standby state to the operation state is supplied from said second capacitor.

14. A semiconductor storage device comprising the power supply circuit according to claim 13.

* * * * *